US005886378A

United States Patent [19]

Wang

[11] Patent Number: 5,886,378

[45] Date of Patent: Mar. 23, 1999

[54] SINGLE POLYSILICON LAYER FLASH $E^2$PROM CELL

[75] Inventor: Patrick C. Wang, Cupertino, Calif.

[73] Assignee: Lattice Semiconductor Corporation, Hillboro, Oreg.

[21] Appl. No.: 179,887

[22] Filed: Jan. 10, 1994

Related U.S. Application Data

[63] Continuation of Ser. No. 901,351, Jun. 19, 1992, abandoned.

[51] Int. Cl.[6] ........................ H01L 27/115; H01L 29/788

[52] U.S. Cl. .......................... 257/318; 257/315; 257/321; 257/322

[58] Field of Search .................................... 257/315, 321, 257/322, 318

[56] References Cited

U.S. PATENT DOCUMENTS 3,952,325 4/1976 Beale et al. ............................ 257/322
4,425,631 1/1984 Adam ..................................... 257/321
4,924,278 5/1990 Logie .

FOREIGN PATENT DOCUMENTS 60-37778 2/1985 Japan .................................... 257/321

OTHER PUBLICATIONS

H. Kume, et al., "A 1.28 $\mu m^2$ Contactless Memory Cell Technology for a 3V–Only 64Mbit EEPROM", *IEDM Dec. 1992 991–993* pp. 24.7.1 to 24.7.3.

*Primary Examiner*—Jerome Jackson, Jr.
*Attorney, Agent, or Firm*—Skjerven, Morrill, MacPherson, Franklin & Friel; Alan H. MacPherson

[57] ABSTRACT

A flash $E^2$PROM cell includes a single polysilicon layer part of which makes up the floating gate of a transistor of the cell, part of which makes up an electrode of a capacitor coupled to the floating gate, and part of which makes up the gate of a second transistor of the cell.

5 Claims, 4 Drawing Sheets

$A_1$ =

$A_2$ =

$A_2'$ = (includes $A_2$)

$A_3$ =

SINGLE POLYSILICON LAYER FLASH $E^2$PROM CELL

This application is a continuation of application Ser. No. 07/901,351, filed Jun. 19, 1992, now abandoned.

BACKGROUND OF THE INVENTION

This invention relates to memory cells, and more particularly to a flash $E^2$PROM cell having only a single polysilicon-containing layer.

DESCRIPTION OF THE PRIOR ART

FIG. 1 shows a typical flash $E^2$PROM cell 10 of the prior art. The cell 10 is made up of a transistor 11 having a substrate 12 of, for example, P type conductivity, with a source 14 and a drain 16 of N type conductivity along a surface of the substrate 12, the source 14 and drain 16 defining therebetween a channel region 18 along the surface of the substrate 12. Overlying the channel region is an oxide layer 20, on which is disposed a first polysilicon layer 22. The polysilicon layer 22 has disposed thereon an oxide layer 24, which in turn has disposed thereon a second polysilicon layer 26. The polysilicon layer 22 is the floating gate of the transistor 11, while the polysilicon layer 26 is the control gate thereof.

As is well known, threshold voltage of the transistor 11 can be changed by addition of electrons to the floating gate 22, or removal of electrons therefrom. In adding electrons to the floating gate 22 (programming the cell 10), typical of a flash $E^2$PROM cell, the control gate 26 and drain 16 are held at a high positive voltage, while the source 14 is held at ground, the voltage being sufficient to bring the transistor 11 into an avalanche condition, so that hot electrons pass through the oxide 20 into the floating gate 22. For removal of electrons from the floating gate 22 (erasing the cell 10), again typical of a flash $E^2$PROM cell, a high positive voltage is applied to the source 14, while the control gate 26 is held at ground, so that electrons are drawn from the floating gate 22 through the oxide 20 to the source 14.

It has been found that this sort of device, called a "double poly" device because of the two polysilicon layers used therein, is difficult to manufacture, being sensitive to slight variations in the manufacturing process. This results in devices which do not function as desired or may not function at all.

A prior art cell 30 containing only a single layer of polysilicon 32, is shown in FIGS. 2, 3 and 4. As shown therein, a P type substrate 34 has N regions 36, 38, 40, and elongated N region 42 formed therein, with the N regions 36, 38 separated by P region 44 and the N regions 38, 40 separated by P region 46.

An oxide layer 48 (removed from FIG. 2 for clarity, but portions of which are shown in FIG. 3 and 4) is disposed over the structure thus described, with thin regions 47A, 47B, 47C, 47D over the regions 44, 46, 40 and 42 respectively with openings 50, 52, 54 defined therein over regions 36, 38 and 40 respectively, and with thick field oxide 49 covering the remainder.

The polysilicon layer 32 includes as a part thereof a polysilicon gate 56 of a transistor 58. The gate 56 is disposed over the thin oxide layer portion 47A overlying the P region 44 thereof, with the N regions 36, 38 on either side of the P region 44 defining the source and drain of the transistor 58, the P region 44 between the source 36 and drain 38 being the channel region of the transistor 58. The polysilicon layer 32 further includes as a part thereof the floating gate 60 of a transistor 62, disposed on thin oxide portion 47B, in turn overlying the P region 46 with the N region 38 thereof being the source (connected to the drain 38 of the first transistor 58) and the N region 40 being the drain thereof.

A portion 64 of the polysilicon layer 32 is disposed over thin oxide layer 47C which defines a tunneling portion 66. The portions 60, 64 of the polysilicon layer 32 connect up with a portion 68 (FIG. 2.) of the polysilicon layer 32, portion 68 disposed on thin oxide layer portion 47D overlying the N region 42. The polysilicon portions 56, 60, 64, 68 make up parts of a single polysilicon layer of the device 30.

The N region 42 is the control gate of the transistor 62, the polysilicon layer portion 68 and N region 42 forming a capacitor 70 as shown in FIG. 3, so that the polysilicon layer portion 60 acts as the floating gate of the transistor 62.

It will readily be seen that this transistor 62 can be programmed or erased in the manner described above, addition of electrons to the floating gate 60 taking place by providing a high positive voltage on the N region 42, and holding the drain 40 at ground. Removal of electrons from the floating gate 60 takes place by providing a high positive voltage on the drain 40, while holding the N region 42 at ground.

While the cell of FIGS. 2, 3 and 4 has the advantage of including only a single polysilicon layer, further advantages may be realized in the cell to lend itself to use as a flash $E^2$PROM cell.

SUMMARY OF THE INVENTION

The present memory cell for particular use as a flash $E^2$PROM cell includes only a single polysilicon-containing layer for (1) the gate of an access transistor, (2) the floating gate of a flash $E^2$PROM transistor, and (3) the electrode of a capacitor, the other electrode of which is the gate of the flash $E^2$PROM transistor. The flash $E^2$PROM transistor is programmed by means of hot electrons passing through the oxide of the transistor to the floating gate with the flash $E^2$PROM transistor in an avalanche state, while the flash $E^2$PROM transistor is erased by electrons tunnelling through an oxide layer not defining a thin tunnelling region.

DESCRIPTION OF THE PREFERRED EMBODIMENT

Figure 5:
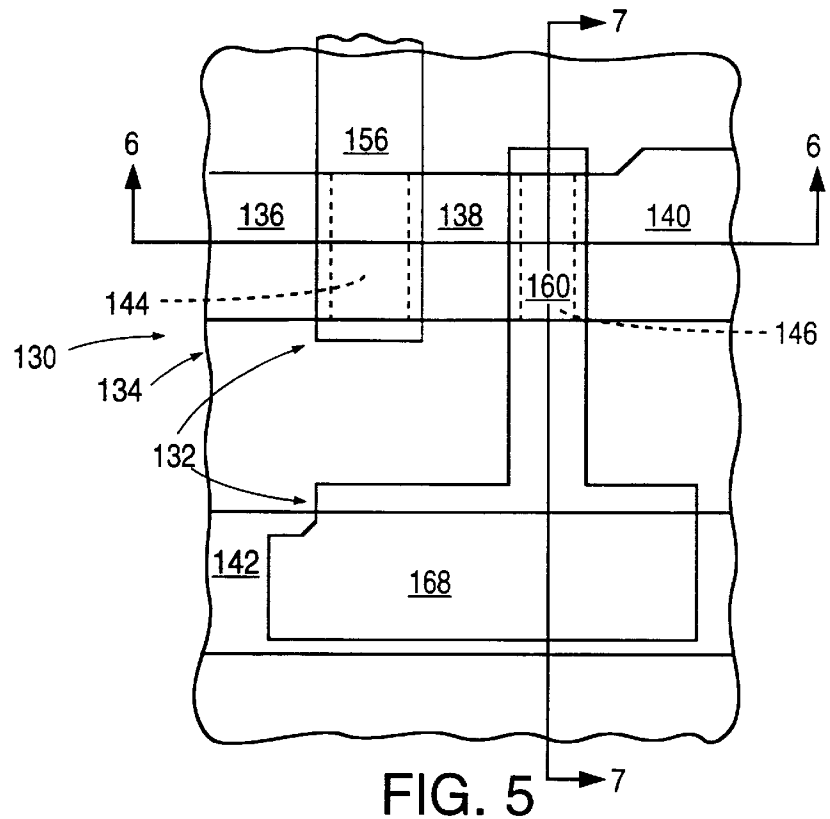
FIG. 5 is a plan view of a flash $E^2$PROM cell in accordance with the present invention.
Figure 6:
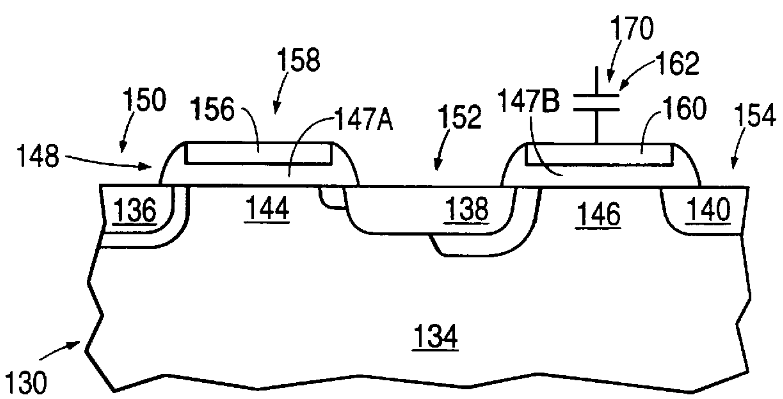
FIG. 6 is a sectional view taken along the line 6—6 of FIG. 5.
Figure 7:
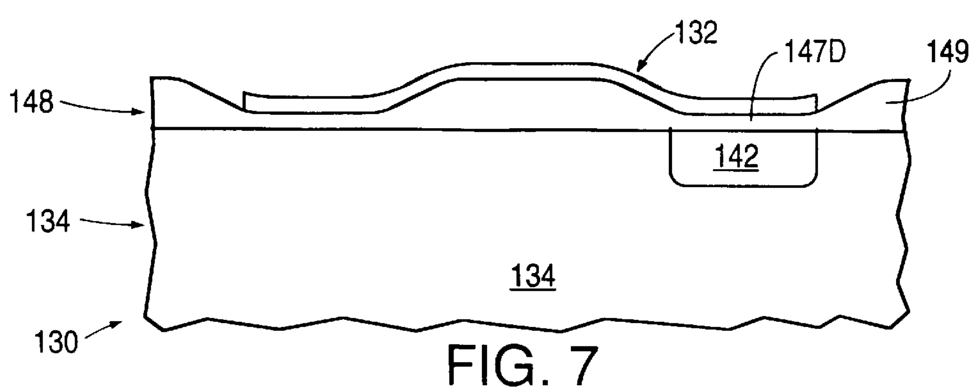
FIG. 7 is a sectional view taken along the line 7—7 of FIG. 5.

As shown in FIGS. 5–7, a P type substrate 134 has elongated N regions 136, 138, 140 and elongated N region 142 formed therein, with the N regions 136, 138 separated by P region 144 and the N regions 138, 140 separated by P region 146.

An oxide layer 148 (removed from FIG. 5 for clarity, but portions of which are shown in FIG. 6 and 7) is disposed over the substrate as in the previous prior art embodiment with thin regions 147A, 147B, 147D over the regions 144, 146, 142 respectively, with openings 150, 152, 154 defined thereon over regions 136, 138, 140 respectively, and with thick field oxide 149 covering the remainder.

A polysilicon layer 132 includes as a part thereof a polysilicon gate 156 of a transistor 158. The gate 156 is disposed over the thin oxide layer portion 147A overlying the P region 144 thereof, with the N regions 136, 138 on either side of the P region 144 defining the source and drain of the transistor 158, the P region 144 between the source 136 and drain 138 being the channel region of the transistor 158. The polysilicon layer 132 further includes as a part thereof the floating gate 160 of a transistor 162, disposed on thin oxide portion 147B, in turn overlying the P region 146, with the N region 138 thereof being the source (connected to the drain 138 of the first transistor 158) and the N region 140 being the drain thereof, the P region 146 being the channel region of the device.

The portion 160 of the polysilicon layer 132 connects up with a portion 168 of the polysilicon layer 132 overlying the N region 142. The polysilicon portions 156, 160, 168 make up parts of a single polysilicon layer of the device 130.

The N region 142 is the control gate of the transistor 162, the polysilicon layer portion 168 and N region 142 forming a capacitor 170 as shown in FIG. 6, so that the polysilicon layer portion 160 acts as the floating gate of the transistor 162.

During programming of the cell 130, i.e., the addition of electrons to the floating gate 160, a high positive voltage is applied to the control gate 142 and the drain 140, while the source 138 is held at ground, the voltage being sufficient to bring the transistor 162 into avalanche condition, so that hot electrons pass from the channel region 146 through the oxide layer 147B into the floating gate 160, changing the threshold voltage of the transistor 162. Erasing of the cell 130 takes place by electron tunneling through the oxide layer 147B, by applying a high positive voltage to the source 138 while holding the control gate 142 at ground.

The transistor 158 acts as an access transistor which must be turned on in order to access the $E^2$PROM transistor 162.

Because the oxide layer 147B is of substantially uniform thickness (FIG. 6) and does not contain a thin portion as in the prior art, the time for erasing the cell 130 may be slightly longer than in the cells previously described. However, because the nature of a flash $E^2$PROM cell array is such that all the cells are erased at the same time, the delay in erasing is not as important as when compared to the erasing of individual cells as chosen, wherein cumulative erasing time of individual cells will add up to cause a substantial delay in the overall erasing of the array. Because of this, the cell of the present invention can be made much simpler than in the prior art, and yet be readily adaptable for use in flash $E^2$PROM technology.

Figure 1:
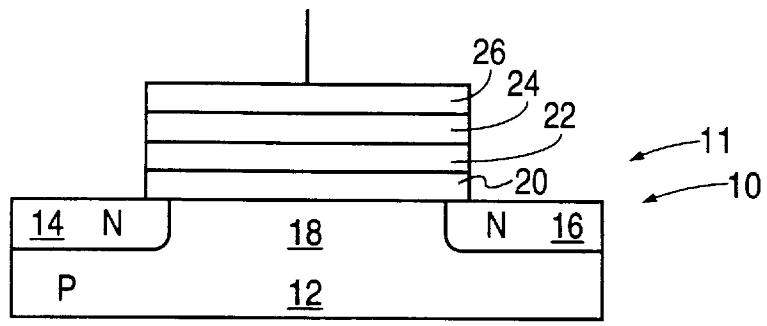
FIG. 1 is a cross-sectional view of a prior art flash $E^2$PROM memory cell.
Figure 2:
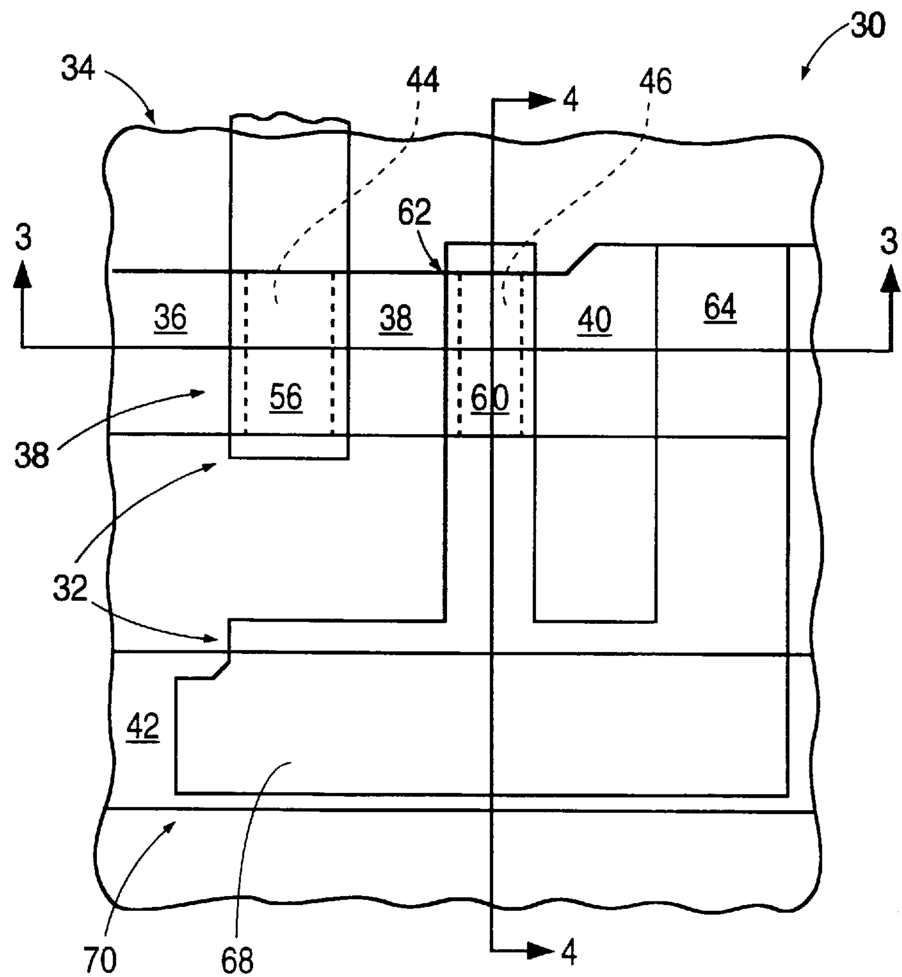
FIG. 2 is a plan view of another prior art $E^2$PROM memory cell.
Figure 3:
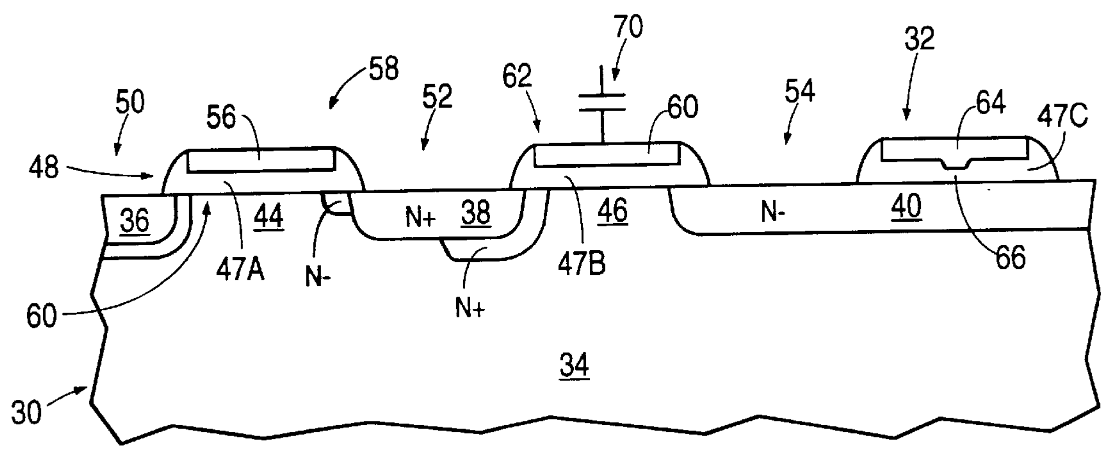
FIG. 3 is a sectional view taken along the line 3—3 of FIG. 2.
Figure 4:
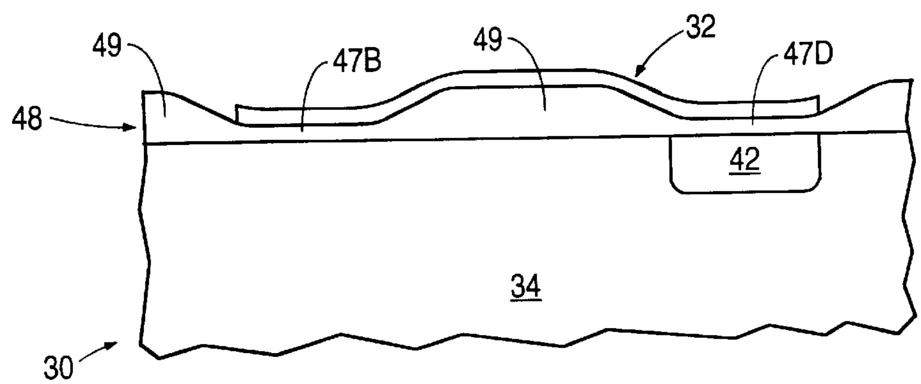
FIG. 4 is a sectional view taken along the line 4—4 of FIG. 2.

That is to say, the oxide layer 147B need not be specially formed with a tunneling portion thereof, and the dimensions of the cell as compared to the cell of FIGS. 2–4 can be reduced, since no such tunneling oxide portion and attendant polysilicon layer portion are needed. It is to be further noted that all this is achieved with the use of only a single polysilicon layer in the device, resulting in simple manufacturing procedures, and resulting in a high yield.

It is to be understood that as an alternative, the layer 132 may not be 100% polysilicon, but may for example be part polysilicon and the balance silicide.

Reference is made to my copending application Ser. No. 07/901,357, filed Jun. 19, 1992, entitled FLASH $E^2$PROM ARRAY, invented by Patrick Wang, commonly owned with this application, carrying Attorney Docket No. M-2101 U.S., and herein incorporated by reference, for descriptions of flash $E^2$PROM arrays in which the present cell can advantageously be used.

Figure 8:
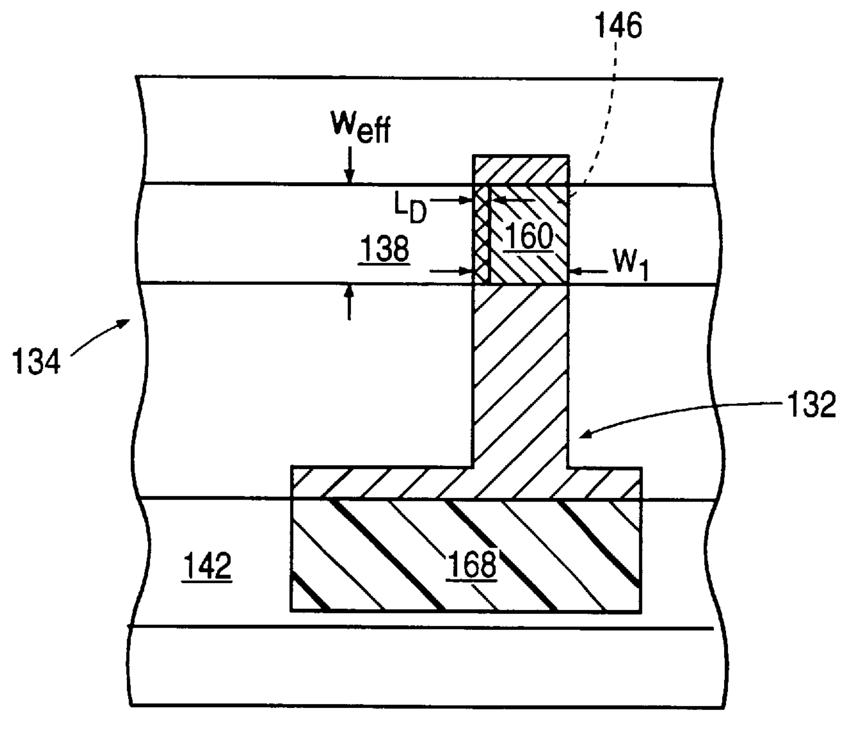
FIG. 8 is a plan view of the transistor of FIGS. 5–7 in a simplified form for illustrating coupling ratios.

In a device of this type, reference is made to FIG. 8 for an understanding of erase coupling capacitance ratio and write coupling capacitance ratio, which are important in the operation of the device.

The following definitions are used:

$A_1$=area of the portion of the polysilicon layer 132 overlying N region 142;

$A_2$=area of the source 138 of the transistor overlain by a portion of the polysilicon layer 132;

$A_2{}^1$=area of the floating gate 160 of the polysilicon layer 132 (includes area $A_2$);

$A_3$=area of portion of the polysilicon layer 132 overlying thick field oxide.

$T_{ox1}$=thickness of thin oxide;

$T_{ox2}$=thickness of thick oxide;

$W_{EFF}$=width of N region (FIG. 8);

LD=width of source region 138 covered by polysilicon layer 132 (FIG. 8)

$W_1$=width of portion of polysilicon layer making up floating gate of transistor (FIG. 8)

The capacitances of various parts of the $E^2$PROM transistor 162 are governed as follows:

$$C_1 \propto \frac{A_1}{T_{ox1}}$$

$$C_2 \propto \frac{A_2}{T_{ox1}} \propto \frac{LD \times W_{EFF}}{T_{ox1}}$$

$$C_2{}^1 \propto \frac{A_2{}^1}{T_{ox1}}$$

$$C_3 \propto \frac{A_3}{T_{ox2}}$$

The erase coupling ratio of the transistor 162 is given as $$\frac{(C_1 + C_3)}{(C_1 + C_2 + C_3)} = \frac{1}{1 + \dfrac{C_2}{C_1 + C_3}}$$

Meanwhile, the write coupling ratio of the transistor 162 is given as $$\frac{C_1}{(C_1 + C'_2 + C_3)}$$

It is important that the erase coupling ratio be high, for example, 0.9 or more, in order to achieve proper and effective erasing of the cell. Meanwhile, the write coupling ratio can be lower, for example, 0.6 being found to be sufficient.

Assume for a given device $A_1$=25 $\mu m^2$

Weff=2.8 $\mu$m

LD=0.2 $\mu$m (so $A_2$=0.56 $\mu m^2$)

$A_3$=21 $\mu m^2$ $T_{ox1}$=120 Å

$T_{ox2}$=5000 Å

$C_1 \propto 25\ \mu m^2$ $C_2 \propto 0.56\ \mu m^2$ $$C_3 \propto 21 \times \frac{120}{5000} = 0.504\,\mu m^2$$

Then, $$C_{(erase)} = \frac{C_1 + C_3}{C_1 + C_2 + C_3} = \frac{25 + .504}{25 + .56 + .504} = \frac{25.504}{26.064} = 0.9785$$

Assume for a given device $A_1$=10 $\mu m^2$ instead of 25 $\mu m^2$ $C_1 \propto 10\ \mu m^2$ $C_2 \propto 0.56\ \mu m^2$ $C_3$4 0.504 $\mu m^2$ then $$C_{erase} = \frac{10 + .504}{10 + .56 + .504} = \frac{10.504}{11.064} = .949$$

Assume $A_1$=40 $\mu m^2$ instead of 25 $\mu m^2$ $C_1 \propto 40\ \mu m^2$ $C_2 \propto 0.56\ \mu m^2$ $C_3 \propto 0.504\ \mu m^2$ $$C_{erase} = \frac{40 + .504}{40 + .56 + .504} = \frac{40.504}{41.064} = .987$$

For programming (write) of the cell, $$C_{prog} = \frac{C_1}{C_1 + C_2{}^1 + C_3}$$

$C_1 \propto A_1$ $C_2{}^1 \propto A_2{}^1\ {}^C{}_3 \propto A_3$

Assuming the same dimensions as in the first example above, and in addition that $W_1$=1.0 $\mu m$ $C_1 \propto 25\ \mu m^2$ $C_2{}^1 \propto 2.8\ \mu m^2$ $C_3 \propto .504\ \mu m^2$ $$C_{prog} = \frac{25}{25 + 2.8 + .504} = 0.88$$

For $A_1 = 10\ \mu m^2$ $$C_{prog} = \frac{10}{10 + 2.8 + .504} = 0.75$$

For $A_1 = 40\ \mu m^2$ $$C_{prog} = \frac{40}{40 + 2.8 + .504} = 0.92$$

It will thus be seen that coupling ratios for erasing are extremely high, while those for programming are also high and compare favorably with a ratio of 0.65 for a conventional flash $E^2$PROM cell.

I claim:

1. An $E^2$PROM cell comprising:

a substrate of a first conductivity type having source, drain and control gate regions of a second conductivity type disposed along a surface of the substrate and extending into the substrate, the source and drain regions defining a channel region therebetween and being separated from the control gate region;

an oxide layer formed on the surface of the substrate and having portions located over the source, drain, channel and control gate regions; and a floating gate formed over the oxide layer and comprising polysilicon, the floating gate being part of the only layer of the cell containing polysilicon, the floating gate consisting solely of:

a first portion located over the control sate region; and an elongated second portion including:

a first part located over portions of the source and drain regions and over the channel region, and a second part connected between the first portion and the first part, wherein the first portion and the control gate region form a first capacitance $C_1$, the first part of the second portion and the source region form a second capacitance $C_2$ and the second part of the second portion and the substrate form a third capacitance $C_3$; and wherein the cell is constructed such that the first, second and third capacitances produce an erase coupling ratio $(C_1+C_3)/(C_1+C_2+C_3)$ which is greater than or equal to 0.9.

2. An $E^2$PROM cell comprising:

a substrate of a first conductivity type having source, drain and control gate regions of a second conductivity type disposed along a surface of the substrate and extending into the substrate, the source and drain regions defining a channel region therebetween and being separated from the control gate region;

an oxide layer formed on the surface of the substrate and having portions located over the source, drain, channel and control gate regions; and a floating gate formed over the oxide layer and comprising polysilicon, the floating gate being part of the only layer of the cell containing polysilicon, the floating gate consisting solely of:

a first portion located over the control gate region; and an elongated second portion including:

a first part located over portions of the source and drain regions and over the channel region, and a second part connected between the first portion and the first part.

wherein the first part of the second portion and the source, drain and channel regions form a fourth capacitance $C_2{}^1$; and wherein the cell is constructed such that the first, third and fourth capacitances produce a write coupling ratio $C_1/(C_1+C_2{}^1+C_3)$ which is greater than or equal to 0.6.

3. The $E^2$PROM cell of claim 2, wherein a programming function of the cell takes place by hot electrons passing through the oxide layer into the first part of the second portion; and wherein an erase function of the cell takes place by electrons tunneling through the oxide layer from the first part of the second portion.

4. The $E^2$PROM cell of claim 2 wherein a portion of the oxide layer located under the first part of the second portion has a substantially uniform thickness.

5. The $E^2$PROM cell of claim 3 wherein a portion of the oxide layer located under the first part of the second portion does not include a thin tunneling oxide portion.

* * * * *

UNITED STATES PATENT AND TRADEMARK OFFICE

CERTIFICATE OF CORRECTION

PATENT NO. : 5,886,378
DATED : 03/23/99
INVENTOR(S) : Wang, Patrick C.

It is certified that error appears in the above-indentified patent and that said Letters Patent is hereby corrected as shown below:

Col. 5, between approximately lines 37 and 38, delete "$C_2^1 \alpha A_2^1$ $C_3 \alpha A_3$," and insert -- $C_2^1 \alpha A_2^1$ --;

Col. 5, between approximately line 38 and line 39, insert -- $C_3 \alpha A_3$--.

Col. 6, line 12, delete "sate" and substitute –gate--; *and* line 63, delete "claim 3" after "of" and insert –claim 2--.

Signed and Sealed this

Sixth Day of March, 2001

*Attest:*

NICHOLAS P. GODICI

*Attesting Officer* *Acting Director of the United States Patent and Trademark Office*